(12) United States Patent
Sun

(10) Patent No.: US 8,415,780 B2
(45) Date of Patent: Apr. 9, 2013

(54) PACKAGE CARRIER AND MANUFACTURING METHOD THEREOF

(75) Inventor: Shih-Hao Sun, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 52 days.

(21) Appl. No.: 13/090,285

(22) Filed: Apr. 20, 2011

(65) Prior Publication Data
US 2012/0181696 A1  Jul. 19, 2012

(30) Foreign Application Priority Data

Jan. 19, 2011 (TW) .............................. 100101972 A

(51) Int. Cl.
*H01L 23/495* (2006.01)
(52) U.S. Cl.
USPC ........... 257/675; 257/676; 257/758; 257/779; 257/E21.159; 257/E23.019; 257/E23.02; 257/E23.021; 257/E23.026; 257/E23.06; 257/E23.061; 438/15; 438/25; 438/27; 438/51; 438/55; 438/64; 438/106; 438/122; 438/464; 438/715

(58) Field of Classification Search .................. None
See application file for complete search history.

(56) References Cited

U.S. PATENT DOCUMENTS

2008/0273313 A1* 11/2008 Wang et al. ................... 361/761

* cited by examiner

*Primary Examiner* — Julio J Maldonado
*Assistant Examiner* — Yasser Abdelaziez
(74) *Attorney, Agent, or Firm* — Jianq Chyun IP Office

(57) ABSTRACT

A manufacturing method of a package carrier is provided. A substrate having an upper and lower surface is provided. A first opening communicating the upper and lower surface of the substrate is formed. A heat conducting element is disposed inside the first opening, wherein the heat conducting element is fixed in the first opening via an insulating material. At least a through hole passing through the substrate is formed. A metal layer is formed on the upper and lower surface of the substrate and inside the through hole. The metal layer covers the upper and lower surface of the substrate, the heat conducting element and the insulating material. A portion of the metal layer is removed. A solder mask is formed on the metal layer. A surface passivation layer is formed and covers the metal layer exposed by the solder mask and the metal layer located inside the through hole.

16 Claims, 6 Drawing Sheets

PACKAGE CARRIER AND MANUFACTURING METHOD THEREOF

CROSS-REFERENCE TO RELATED APPLICATION

This application claims the priority benefit of Taiwan application serial no. 100101972, filed Jan. 19, 2011. The entirety of the above-mentioned patent application is hereby incorporated by reference herein and made a part of this specification.

BACKGROUND OF THE INVENTION

1. Field of the Invention

The invention relates to a chip package structure and a manufacturing method thereof. More particularly, the invention relates to a package carrier and a manufacturing method thereof.

2. Description of Related Art

The purpose of a chip package is to protect a bare chip, lower the chip contact density, and provide the chip with good heat dissipation. A leadframe serving as a carrier of a chip is frequently employed in a conventional wire bonding technique. As contact density on a chip gradually increases, the leadframe which is unable to satisfy current demands on the high contact density is replaced by a package substrate which can achieve favorable contact density. Besides, the chip is packaged onto the package substrate by conductive media, such as metal wires or bumps.

Regarding current and common light emitting diode (LED) package structures, an LED chip is packaged before use. The LED chip emits light and generates a large amount of thermal energy simultaneously. If the thermal energy generated by the LED chip is unable to quickly dissipate and amasses within the LED package structure, the temperature of the LED package structure will be raised continuously. Therefore, the LED chip may have decayed illumination and a shorter lifetime, and if serious, may even have permanent damage due to overheating.

Since the thermal expansion coefficients of a LED chip and a package carrier are mismatched, the generated thermal stress and warpage are more and more critical so that the reliability of the LED package structure is lowered. Thus, besides enhancing the light extraction efficiency, the current package technology focuses on decreasing the thermal stress of the package structure to increase the lifetime and the reliability.

SUMMARY OF THE INVENTION

The invention is directed to a package carrier, suitable for carrying a heat generating component.

The invention is directed to a manufacturing method used to manufacture the package carrier.

The invention provides a method of fabricating a package carrier. The method includes the following steps. A substrate is provided. The substrate has a top surface and a bottom surface opposite to the top surface. A first opening communicating the upper surface and the lower surface of the substrate is formed. A heat conducting element inside the first opening of the substrate is formed, wherein the heat conducting element is fixed in the first opening of the substrate via an insulating material. At least a through hole passing through the substrate is formed. A metal layer is formed on the upper surface and the lower surface of the substrate and inside the through hole, wherein the metal layer covers the upper surface, the lower surface, the heat conducting element, and the insulating material of the substrate. A portion of the metal layer is removed. A solder mask is formed on a metal layer. A surface passivation layer is formed and covers a portion of the metal layer exposed by the solder mask and a portion of the metal layer located inside the through hole.

The invention further provides a package carrier, suitable for packaging a heat generating component. The package carrier includes a substrate, a heat conducting element, an insulating material, a metal layer, a solder mask, and a surface passivation layer. The substrate has an upper surface, a lower surface opposite to the upper surface, a first opening communicating the upper surface and the lower surface and at least a through hole. The heat conducting element is disposed in the first opening of the substrate. The insulating material is filled in the first opening of the substrate to fix the heat conducting element within the first opening of the substrate. The metal layer is disposed on the upper surface, the lower surface, and the through hole of the substrate, wherein the metal layer exposes a portion of the substrate. The solder mask is disposed on the metal layer. The surface passivation layer covers a portion of the metal layer exposed by the solder mask and a portion of the metal layer located inside the through hole, and the heat conducting element is disposed on a portion of the surface passivation layer over the heat conducting element.

Based on the above, the package carrier of the invention has a heat conducting element, and the heat conducting element is embedded in the substrate. Therefore, when a heat generating component mounted on the package carrier generates heat, the heat conducting element and the metal layer of the substrate can quickly transmit the heat to the outside. Therefore, the package carrier of the invention can effectively dissipate the heat generated by the heat generating component, and thus improves the effectiveness and longevity of the heat generating component.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1A:
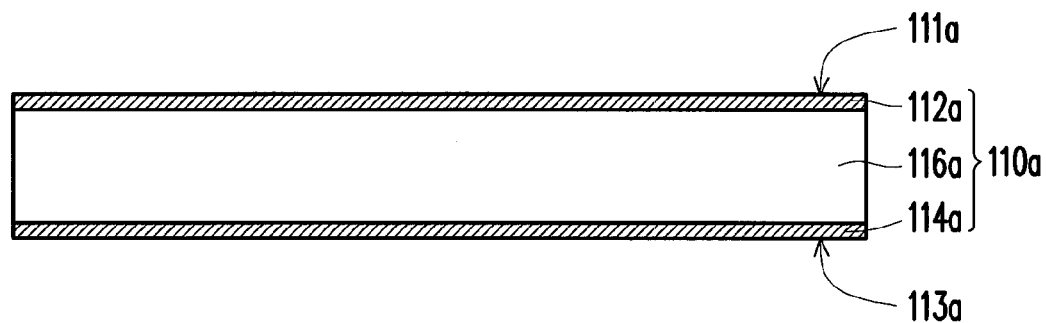
FIG. 1A through FIG. 1E are cross-sectional views illustrating a manufacturing method of a package carrier according to an embodiment of the invention.

FIG. 1A through FIG. 1E are cross-sectional views illustrating a manufacturing method of a package carrier according to an embodiment of the invention. Referring to FIG. 1A, in a manufacturing method of a package carrier according to the embodiment, a substrate 110a is provided, wherein the substrate 110a has an upper surface 111a and a lower surface 113a opposite to the upper surface 111a. In the embodiment, the substrate 110a is formed by, for example, a first copper foil 112a, a second copper foil 114a, and an insulating layer 116a. The insulating layer 116a is disposed between the first copper foil 112a and the second copper foil 114a. That is to say, the substrate 110a of the embodiment is a double-sided plate.

Figure 1B:
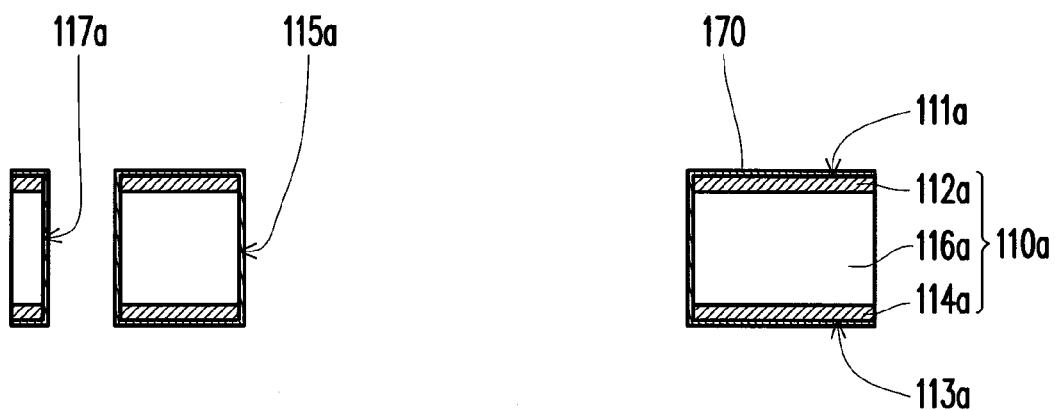

Next, referring to FIG. 1B, a first opening 115a communicating the upper surface 111a and the lower surface 113a of the substrate 110a is formed, wherein the step of forming the first opening 115a is, for example, punching or routing.

Still referring to FIG. 1B, at least a through hole 117a passing through the substrate 110a is formed (FIG. 1B only shows one), wherein the step of forming the through hole 117a is, for example, mechanical drilling or laser drilling. In order to increase the reliability of follow-up steps, an electroplating seed layer 170 is formed on the upper surface 111a and the lower surface 113a of the substrate 110a, the inner wall of the through hole 117a, and the inner wall of the first opening 115a.

Figure 1C:
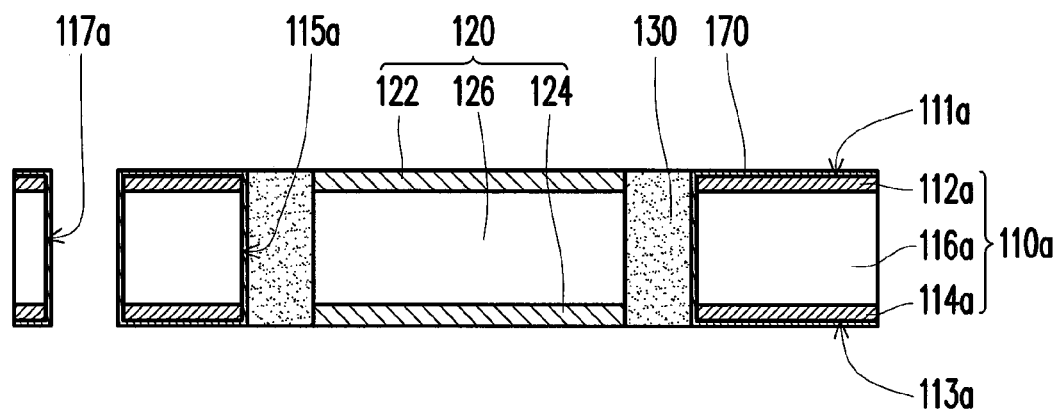

Referring to FIG. 1C, a heat conducting element 120 is disposed inside the first opening 115a of the substrate 110a, wherein the heat conducting element 120 is, for example, fixed in the first opening 115a of the substrate 110a via an insulating material 130. That is to say, the insulating material 130 is disposed in the first opening 115a of the substrate 110a to fix the position of the heat conducting element 120 relative to the substrate 110a.

In the embodiment, the heat conducting element 120 is constructed through a first conductive layer 122, a second conductive layer 124, and an insulating material layer 126. The insulating material layer 126 is disposed between the first conductive layer 122 and the second conductive layer 124. A thermal expansion coefficient of the heat conducting element 120 is less than a thermal expansion coefficient of the substrate 110a, and a thermal conductivity coefficient of the heat conducting element 120 is greater than a thermal conductivity coefficient of the substrate 110a. In detail, the thermal expansion coefficient of the heat conducting element 120 is, for example, 3 to 30 ppm/° C., and the thermal conductivity coefficient of the heat conducting element 120 is between 20 and 500 W/m*K. The thermal conductivity coefficient of the insulating material layer 126 of the heat conducting element 120 is greater than the thermal conductivity coefficient of the insulating layer 116a of the substrate 110a. In addition, a material of the heat conducting element 120 is, for example, ceramic with through silicon via (TSV), ceramic without TSV, silicon with TSV, silicon without TSV, silicon carbide, diamond, or metal.

It should be noted that the invention does not limit the sequence of the steps of forming the through hole 117a and disposing the heat conducting element 120, even though the steps are described as first forming the through hole 117a and then disposing the heat conducting element 120 in the first opening 115a of the substrate 110a. Of course, in another embodiment, the heat conducting element 120 can first be disposed in the first opening 115a of the substrate 110a, and then the through hole 117a is formed. Hence, the sequence of the steps of forming the through hole 117a and disposing the heat conducting element 120 is merely exemplary and is not limited thereto.

Figure 1D:
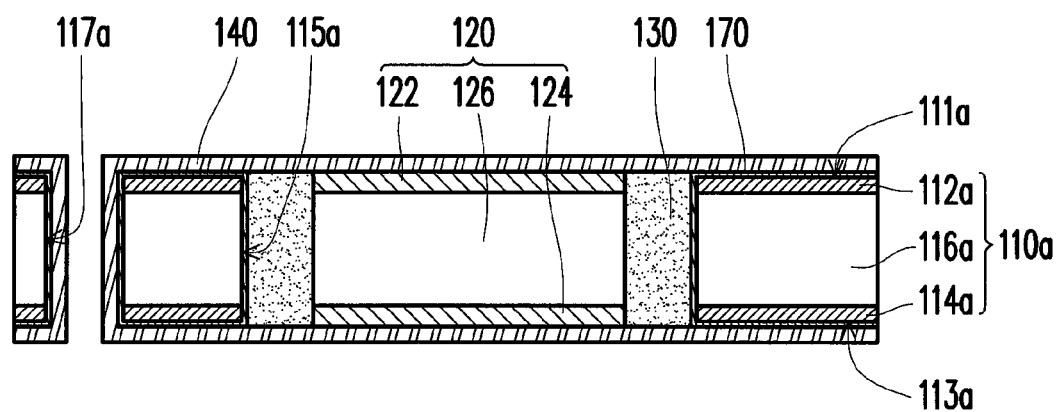

Next, referring to FIG. 1D, a metal layer 140 is formed on the upper surface 111a and the lower surface 113a of the substrate 110a and on the electroplating seed layer 170 inside the through hole 117a, wherein the metal layer 140 covers the upper surface 111a and the lower surface 113a of the substrate 110a, the heat conducting element 120, and the insulating material 130. In the embodiment, the step of forming the metal layer 140 is, for example, electroplating, wherein the electroplating seed layer 170 can increase the reliability of electroplating the metal layer 140.

Figure 1E:
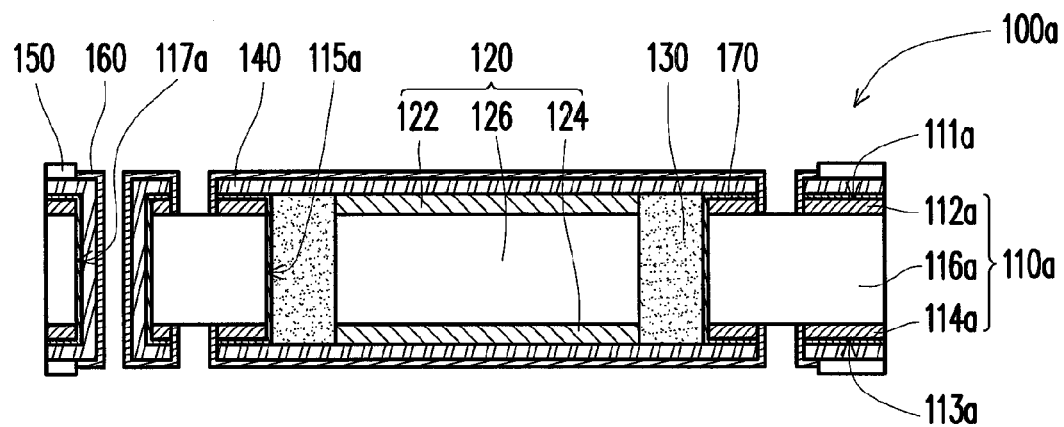

Referring to FIG. 1E, a portion of the metal layer 140 and a portion of the electroplating seed layer 170 under the portion of the metal layer 140, a portion of the first copper foil 112a, and a portion of the second copper foil 114a are removed to expose a portion of the insulating layer 116a. Then, a solder mask 150 is formed on the metal layer 140. Finally, a surface passivation layer 160 is formed, wherein the surface passivation layer 160 covers a portion of the metal layer 140 exposed by the solder mask 150 and a portion of the metal layer 140 located inside the through hole 117a, and further covers a portion of the first copper foil 112a and a portion of the second copper foil 114a exposed by the insulating layer 116a. In the embodiment, a material of the surface passivation layer 160 includes, for example, Ni and Au. As such, the package carrier 100a is completely formed.

Structurally, the package carrier 100a of the embodiment includes the substrate 110a, the heat conducting element 120, the insulating material 130, the metal layer 140, the solder mask 150, and the surface passivation layer 160. The substrate 110a is constructed of the first copper foil 112a, the second copper foil 114a, and the insulating layer 116a. The substrate 110a has the upper surface 111a, and the lower surface 113a opposite to the upper surface 111a, the first opening 115a communicating the upper surface 111a and the lower surface 113a and at least a through hole 117a. The heat conducting element 120 is disposed in the first opening 115a of the substrate 110a. The insulating material 130 is filled in the first opening 115a of the substrate 110a to fix the heat conducting element 120 within the first opening 115a of the substrate 110a. The metal layer 140 is disposed on the upper surface 111a and the lower surface 113a of the substrate 110a and inside the through hole 117a, and the metal layer 140 exposes a portion of the substrate 110a. The solder mask 150 is disposed on the metal layer 140. The surface passivation layer 160 covers a portion of the metal layer 140 exposed by the solder mask 150 and a portion of the metal layer 140 located inside the through hole 117a, and further covers a portion of the first copper foil 112a and a portion of the second copper foil 114a exposed by the insulating layer 116a.

Figure 2:
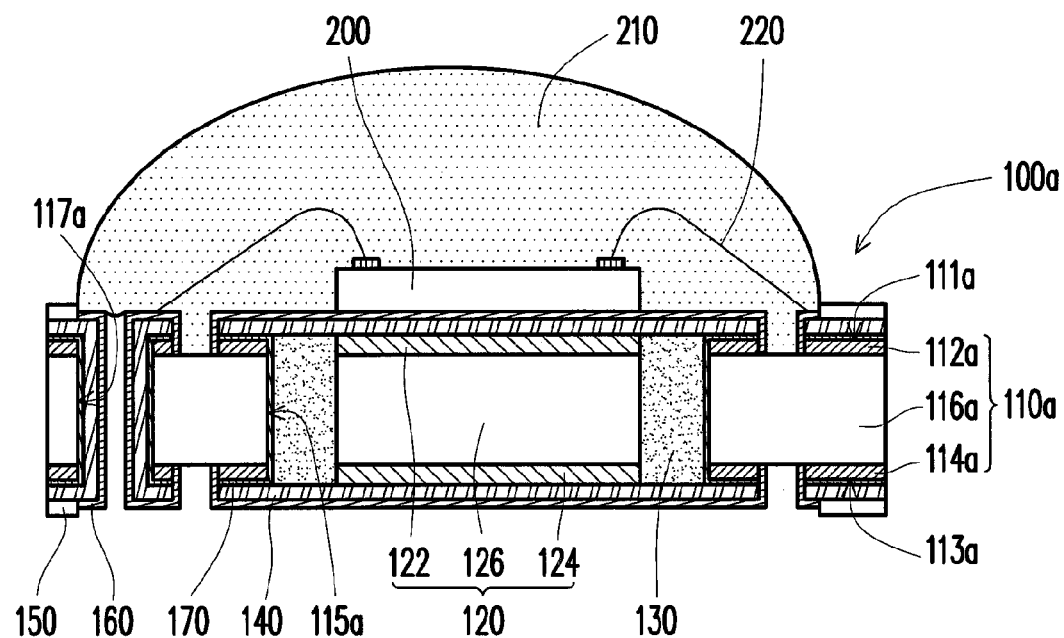
FIG. 2 is a cross-sectional view illustrating the package carrier of FIG. 1E carrying a heat generating component.

FIG. 2 is a cross-sectional view illustrating the package carrier of FIG. 1E carrying a heat generating component. Referring to FIG. 2, in the embodiment, the package carrier 100a is suitable to carry a heat generating component 200, wherein the heat generating component 200 is disposed on a portion of the surface passivation layer 160 over the heat conducting element 120, and the heat generating component 200 is, for example, an electronic chip or an optoelectronic component, but the invention is not limited thereto. For example, the electronic chip can be an integrated circuit chip such as a graphic chip or a memory chip, and can be a single chip or a chip module. The optoelectronic component is, for example, an LED, a laser diode, or a high intensity discharge lamp. The heat generating component 200 is described as an LED.

In detail, the heat generating component 200 (e.g. a semiconductor chip) can be electrically connected to the surface passivation layer 160 through wire bonding with a plurality of conductive wires 220. An encapsulant 210 can also be used to cover the heat generating component 200, the conductive wires 220 and a portion of the package carrier 100a so as to protect the electrical connection between the heat generating component 200, and the conductive wires 220 and the package carrier 100a. Since the thermal expansion coefficient of the heat conducting element 120 of the embodiment is less than the thermal expansion coefficient of the substrate 110a, the difference between the thermal expansion coefficients of the heat generating component 200, the heat conducting element 120 and the substrate 110a can be gradually decreased. Thus, the increase of stress because of the thermal expansion coefficient difference from being too great between the heat generating component 200, the heat conducting element 120, and the substrate 110a can be avoided. Also, the heat generating component 200 can be prevented from peeling and damage, and thus the reliability of the package carrier 100a is raised.

In addition, since the thermal conductivity coefficient of the heat conducting element 120 is greater than the thermal conductivity coefficient of the substrate 110a, and the heat conducting element 120 is embedded in the substrate 110a, the heat generated by the heat generating component 200 disposed on the package carrier 100a can be quickly transmitted to the outside through the heat conducting element 120 and the metal layer 140 on the substrate 110a. Therefore, the package carrier 100a of the embodiment can effectively dissipate the heat generated by the heat generating component 200, and thus the effectiveness and longevity of the heat generating component 200 is improved.

It should be noted that even though the embodiment describes the heat generating component 200 is electrically connected to the package carrier 100a and the metal layer 140 through wire bonding, the invention does not limit the bonding type between the heat generating component 200 and the package carrier 100a, and the type of the heat generating component 200. In another embodiment, the heat generating component 200 can also be electrically connected and located on the metal layer 140 over the heat conducting element 120 through a plurality of bumps (not shown) by flip chip bonding. In still another embodiment, the heat generating component 200 can be a chip package (not shown) mounted on the package carrier 100a through surface mount technology (SMT). The bonding type between the heat generating component 200 and the package carrier 100a and the type of the heat generating component 200 are merely exemplary and should not be construed as limitations to the invention.

Figure 3A:
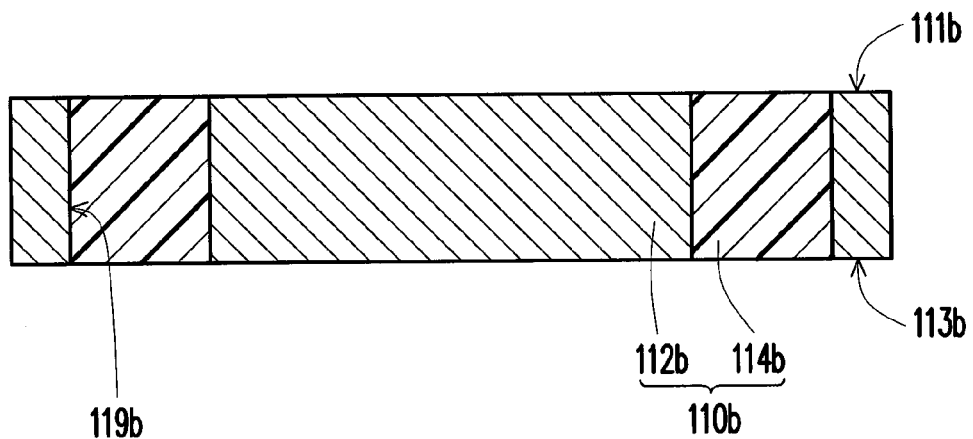
FIG. 3A through FIG. 3E are cross-sectional views illustrating a manufacturing method of a package carrier according to another embodiment of the invention.

FIG. 3A through FIG. 3E are cross-sectional views illustrating a manufacturing method of a package carrier according to another embodiment of the invention. Referring to FIG. 3A, in a manufacturing method of the package carrier according to the embodiment, the substrate 110b is provided, wherein the substrate 110b has an upper surface 111b and a lower surface 113b opposite to the upper surface 111b. In the embodiment, the substrate 110b is, for example, constructed by a metal plate 112b and at least an insulating block 114b (FIG. 3A shows two), wherein the metal plate 112b has at least a second opening 119b (FIG. 3 shows two) communicating the upper surface 111b and the lower surface 113b, and these insulating blocks 114b are disposed in the second openings 119b.

Figure 3B:
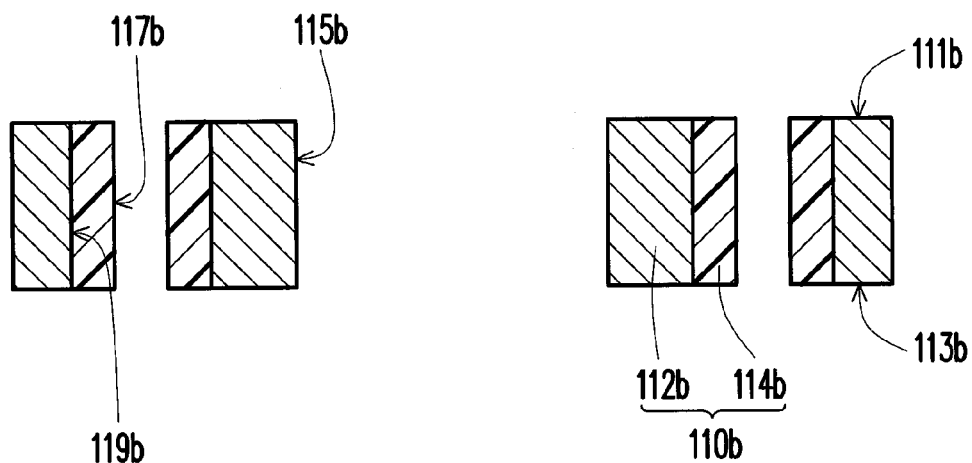

Next, referring to FIG. 3B, a first opening 115b passing through the metal plate 112b is formed, wherein the step of forming the first opening 115b is, for example, punching or routing.

Still referring to FIG. 3B, at least a through hole 117b (FIG. 3B shows two) passing through the insulating block 114b is formed, wherein the step of forming the through hole 117b is, for example, mechanical drilling or laser drilling.

Figure 3C:
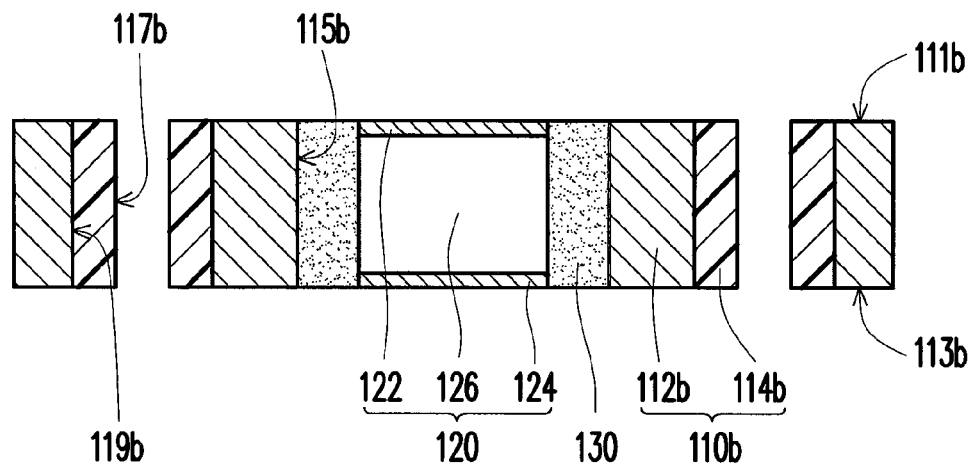

Referring to FIG. 3C, the heat conducting element 120 is disposed inside the first opening 115b, wherein the heat conducting element 120 is, for example, fixed in the first opening 115b via an insulating material 130. That is to say, the insulating material 130 is disposed in the first opening 115b to fix the position of the heat conducting element 120 relative to the substrate 110b.

In the embodiment, the heat conducting element 120 is constructed through the first conductive layer 122, the second conductive layer 124, and the insulating material layer 126. The insulating material layer 126 is disposed between the first conductive layer 122 and the second conductive layer 124. A thermal expansion coefficient of the heat conducting element 120 is less than a thermal expansion coefficient of the substrate 110b, and a thermal conductivity coefficient of the heat conducting element 120 is greater than a thermal conductivity coefficient of the substrate 110b. In detail, the thermal expansion coefficient of the heat conducting element 120 is, for example, 3 to 30 ppm/° C., and the thermal conductivity coefficient of the heat conducting element 120 is between 20 and 500 W/m*K. In addition, a material of the heat conducting element 120 is, for example, ceramic with through silicon via (TSV), ceramic without TSV, silicon with TSV, silicon without TSV, silicon carbide, diamond, or metal.

It should be noted that the invention does not limit the sequence of the steps of forming the through hole 117b and disposing the heat conducting element 120, even though the steps are described as first forming the through hole 117b and then disposing the heat conducting element 120 in the first opening 115b. Of course, in another embodiment, the heat conducting element 120 can first be disposed in the first opening 115b, and then the through hole 117b is formed. Hence, the sequence of the steps of forming the through hole 117b and disposing the heat conducting element 120 is merely exemplary and is not limited thereto.

Figure 3D:
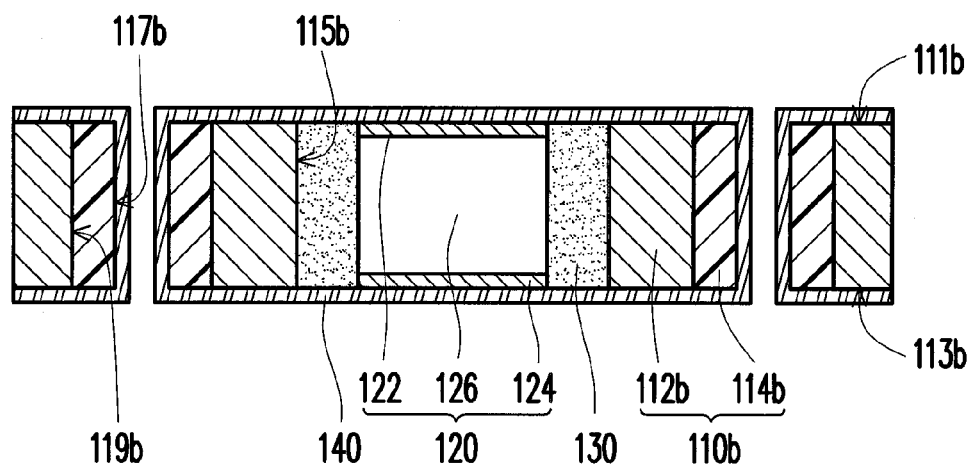

Next, referring to FIG. 3D, a metal layer 140 is formed on the upper surface 111b and the lower surface 113b of the substrate 110b and inside the through hole 117b of the substrate 110b, wherein the metal layer 140 covers the upper surface 111b and the lower surface 113b of the substrate 110b, the heat conducting element 120, and the insulating material 130. In the embodiment, the step of forming the conductive layer 140 is, for example, electroplating.

Figure 3E:
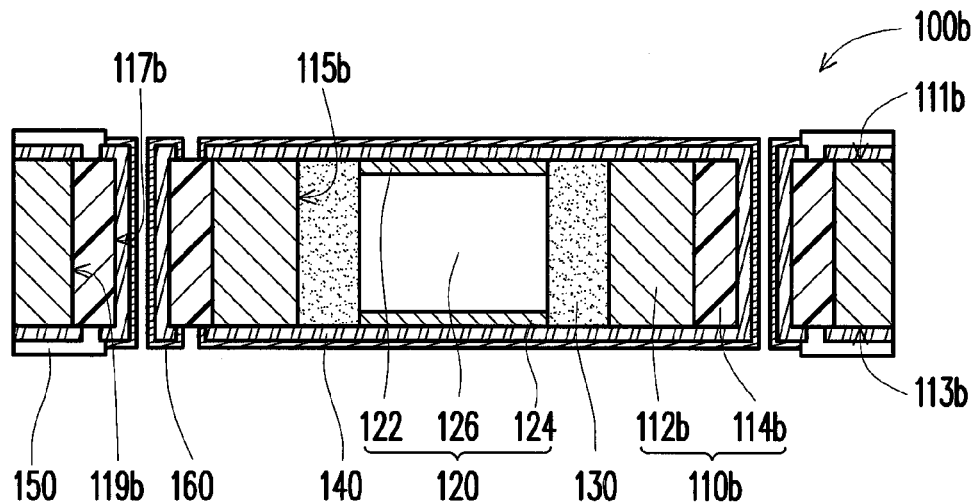

Next, referring to FIG. 3E, a portion of the metal layer 140 is removed to expose a portion of each of the insulating blocks 114b located in the second opening 119b. Then, a solder mask 150 is formed on the metal layer 140. Finally, a surface passivation layer 160 is formed, wherein the surface passivation layer 160 covers a portion of the metal layer 140 exposed by the solder mask 150 and a portion of the metal layer 140 located inside the through hole 117b, and further covers a portion of the metal layer 140 exposed by the insulating block 114b. In the embodiment, a material of the surface passivation layer 160 includes, for example, Ni and Au. As such, a package carrier 100b is completely formed.

Structurally, the package carrier 100b of the embodiment includes the substrate 110b, the heat conducting element 120, the insulating material 130, the metal layer 140, the solder mask 150, and the surface passivation layer 160. The substrate 110b is constructed of the metal plate 112b and the insulating blocks 114b. The substrate 110b has the upper surface 111b and the lower surface 113b opposite to the upper surface 111b. The metal plate 112b has the first opening 115b and the second opening 119b, and the insulating blocks 114b have the through holes 117b. The heat conducting element 120 is disposed in the first opening 115b of the metal plate 112b. The insulating material 130 is filled in the first opening 115b to fix the heat conducting element 120 within the first opening 115b. The metal layer 140 is disposed on the upper surface 111b and the lower surface 113b of the substrate 110b and inside the through hole 117b, and exposes a portion of each of the insulating block 114b located on the corresponding second opening 119b. The solder mask 150 is disposed on the metal layer 140. The surface passivation layer 160 covers a portion of the metal layer 140 exposed by the solder mask 150 and a portion of the metal layer 140 located inside the through hole 117b, and further covers a portion of the metal layer 140 exposed by the insulating block 114b.

Figure 4:
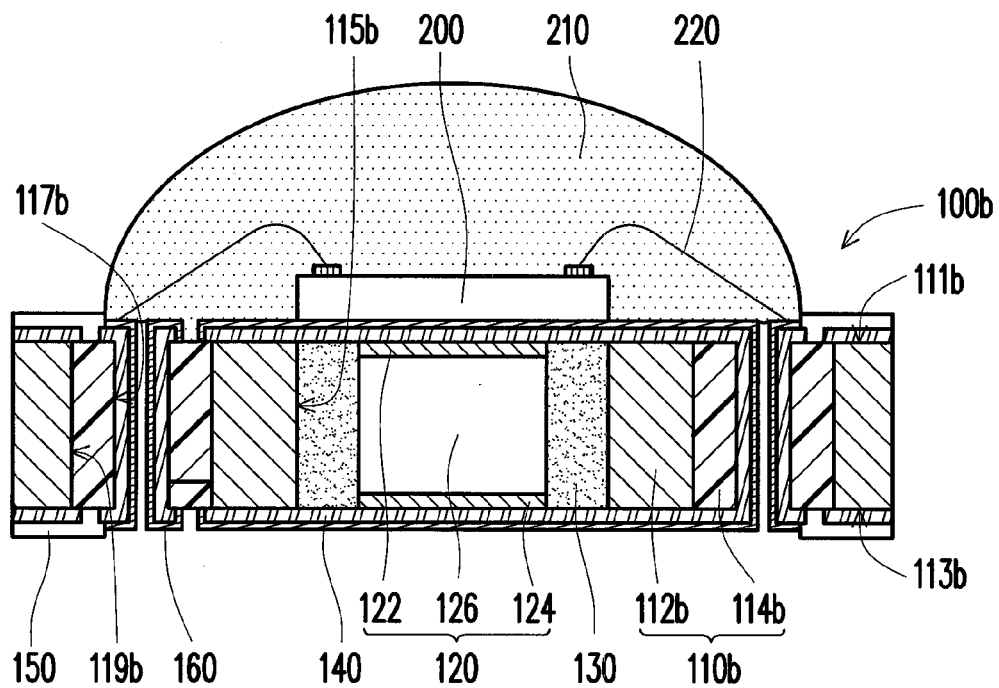
FIG. 4 is a cross-sectional view illustrating the package carrier of FIG. 3E carrying a heat generating component.

FIG. 4 is a cross-sectional view illustrating the package carrier of FIG. 3E carrying a heat generating component. Referring to FIG. 4, in the embodiment, the package carrier 100b is suitable to carry a heat generating component 200, wherein the heat generating component 200 is disposed on a portion of the surface passivation layer 160 over the corresponding heat conducting element 120, and the heat generating component 200 is, for example, an electronic chip or an optoelectronic component, but the invention is not limited thereto. For example, the electronic chip can be an integrated circuit chip such as a graphic chip or a memory chip, and can be a single chip or a chip module. The optoelectronic component is, for example, an LED, a laser diode, or a high intensity discharge lamp. The heat generating component 200 is described as an LED.

In detail, the heat generating component 200 (e.g. a semiconductor chip) can be electrically connected to the surface passivation layer 160 through wire bonding with a plurality of conductive wires 220. An encapsulant 210 can also be used to cover the heat generating component 200, the conductive wires 220 and a portion of the package carrier 100b so as to protect the electrical connection between the heat generating component 200, and the conductive wires 220 and the package carrier 100b. Since the thermal expansion coefficient of the heat conducting element 120 of the embodiment is less than the thermal expansion coefficient of the substrate 110b, the difference between the thermal expansion coefficients of the heat generating component 200, the heat conducting element 120 and the substrate 110b can be gradually decreased. Thus, the increase of stress because of the thermal expansion coefficient difference from being too great between the heat generating component 200, the heat conducting element 120, and the substrate 110b can be avoided. Also, the heat generating component 200 can be prevented from peeling and damage, and thus the reliability of the package carrier 100b is raised.

In addition, since the thermal conductivity coefficient of the heat conducting element 120 is greater than the thermal conductivity coefficient of the substrate 110b, and the heat conducting element 120 is embedded in the substrate 110b, the heat generated by the heat generating component 200 disposed on the package carrier 100b can be quickly transmitted to the outside through the heat conducting element 120 and the metal layer 140 on the substrate 110b. Therefore, the package carrier 100b of the embodiment can effectively dissipate the heat generated by the heat generating component 200, and thus the effectiveness and longevity of the heat generating component 200 is improved.

It should be noted that even though the embodiment describes the heat generating component 200 is electrically connected to the package carrier 100b and the metal layer 140 through wiring bonding, the invention does not limit the bonding type between the heat generating component 200 and the package carrier 100b, and the type of the heat generating component 200. In another embodiment, the heat generating component 200 can also be electrically connected and located on the metal layer 140 over the heat conducting element 120 through a plurality of bumps (not shown) by flip chip bonding. In still another embodiment, the heat generating component 200 can be a chip package (not shown) mounted on the package carrier 100b through surface mount technology (SMT). The bonding type between heat generating component 200 and the package carrier 100b and the type of the heat generating component 200 are merely exemplary and should not be construed as limitations to the invention.

To sum up, since the package carrier of the invention has a heat conducting element, and the heat conducting element is embedded in the substrate so that the heat generated by the heat generating component disposed on the package carrier can be quickly transmitted to the outside through the heat conducting element and the metal layer on the substrate. Therefore, the package carrier of the invention can effectively dissipate the heat generated by the heat generating component, and thus the effectiveness and longevity of the heat generating component is improved. Since the thermal expansion coefficient of the heat conducting element of the invention is less than the thermal expansion coefficient of the substrate, the difference between the thermal expansion coefficients of the heat generating component, the heat conducting element and the substrate can be gradually decreased. Thus, the increase of stress because of the thermal expansion coefficient difference from being too great between the heat generating component, the heat conducting element, and the substrate can be avoided. Also, the heat generating component can be prevented from peeling and damage, and thus the reliability of the package carrier is raised.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A manufacturing method of a package carrier, comprising:
   providing a substrate, the substrate including an upper surface and a lower surface opposite to the upper surface;
   forming a first opening communicating the upper surface and the lower surface of the substrate;
   disposing a heat conducting element inside the first opening of the substrate, wherein the heat conducting element is fixed in the first opening of the substrate via an insulating material;
   forming at least a through hole passing through the substrate;
   forming a metal layer on the upper surface and the lower surface of the substrate and inside the through hole, wherein the metal layer covers the upper surface, the lower surface, the heat conducting element, and the insulating material of the substrate;
   removing a portion of the metal layer;
   forming a solder mask on the metal layer; and
   forming a surface passivation layer covering a portion of the metal layer exposed by the solder mask and a portion of the metal layer located inside the through hole.

2. The manufacturing method of a package carrier as claimed in claim 1, wherein the substrate includes a first copper foil, a second copper foil, and an insulating layer, and the insulating layer is disposed between the first copper foil and the second copper foil.

3. The manufacturing method of a package carrier as claimed in claim 2, further comprising:
   when removing a portion of the metal layer, removing a portion of the first copper foil and a portion of the second copper foil of a lower portion of the metal layer to expose a portion of the insulating layer; and
   when forming the surface passivation layer, the surface passivation layer further covering a portion of the first copper foil and a portion of the second copper foil exposed by the insulating layer.

4. The manufacturing method of a package carrier as claimed in claim 1, wherein the substrate includes a metal plate and at least one insulating block, the metal plate has a first opening, and the insulating block has the through hole.

5. The manufacturing method of a package carrier as claimed in claim 4, further comprising:
   before forming the through hole, forming at least a second opening passing through the metal plate and communicating the upper surface and the lower surface of the substrate;
   after forming the second opening, forming the insulating block in the second opening of the substrate; and
   forming the through hole passing through the insulating block.

6. The manufacturing method of a package carrier as claimed in claim 5, further comprising:
   removing a portion of the metal layer until a portion of the insulating block located in the second opening is exposed; and
   when forming the surface passivation layer, the surface passivation layer further covering a portion of the metal layer exposed by the insulating block.

7. The manufacturing method of a package carrier as claimed in claim 1, wherein the heat conducting element includes a first conductive layer, a second conductive layer, and an insulating material layer, and the insulating material layer is located between the first conductive layer and the second conductive layer.

8. The manufacturing method of a package carrier as claimed in claim 1, wherein a material of the heat conducting element includes ceramics, silicon, silicon carbide, diamond, or metal.

9. The manufacturing method of a package carrier as claimed in claim 1, wherein the step of forming the metal layer includes electroplating.

10. The manufacturing method of a package carrier as claimed in claim 1, wherein a thermal expansion coefficient of the heat conducting element is less than a thermal expansion coefficient of the substrate, and a thermal conductivity coefficient of the heat conducting element is greater than a thermal conductivity coefficient of the substrate.

11. A package carrier, suitable for carrying a heat generating component, the package carrier comprising:
   a substrate having an upper surface, a lower surface opposite to the upper surface, a first opening communicating the upper surface and the lower surface and at least a through hole;
   a heat conducting element disposed in the first opening of the substrate;
   an insulating material filled in the first opening of the substrate to fix the heat conducting element within the first opening of the substrate;
   a metal layer disposed on the upper surface, the lower surface, and the through hole of the substrate, wherein the metal layer exposes a portion of the substrate;
   a solder mask disposed on the metal layer; and
   a surface passivation layer covering a portion of the metal layer exposed by the solder mask and a portion of the metal layer located inside the through hole, and the heat conducting element being disposed on a portion of the surface passivation layer over the heat conducting element.

12. The package carrier as claimed in claim 11, wherein the substrate includes a first copper foil, a second copper foil, and an insulating layer, the insulating layer is disposed between the first copper foil and the second copper foil, the metal layer exposing a portion of the insulating layer, and the surface passivation layer further covers a portion of the first copper foil and a portion of the second copper foil exposed by the insulating layer.

13. The package carrier as claimed in claim 11, wherein the substrate includes a metal plate and at least an insulating block, the metal plate has a first opening, the insulating block has the through hole, the metal plate further includes at least a second opening, the insulating block is disposed in the second opening, and the metal layer exposes a portion of the insulating block disposed in the second opening, and the surface passivation layer further covers a portion of the metal layer exposed by the insulating block.

14. The package carrier as claimed in claim 11, wherein the heat conducting element includes a first conductive layer, a second conductive layer, and an insulating material layer, and the insulating material layer is located between the first conductive layer and the second conductive layer.

15. The package carrier as claimed in claim 11, wherein a material of the heat conducting element includes ceramics, silicon, silicon carbide, diamond, or metal.

16. The package carrier as claimed in claim 11, wherein a thermal expansion coefficient of the heat conducting element is less than a thermal expansion coefficient of the substrate, and a thermal conductivity coefficient of the heat conducting element is greater than a thermal conductivity coefficient of the substrate.

* * * * *